(12) United States Patent
Zhang et al.

(10) Patent No.: US 7,843,249 B2
(45) Date of Patent: Nov. 30, 2010

(54) ADAPTIVE CAPACITIVE TOUCH SENSE CONTROL CIRCUIT

(75) Inventors: Zhong Zhang, Shanghai (CN); Jiantao Cheng, Shanghai (CN); Ke Wu, Shanghai (CN); Chaoqun Wu, Shanghai (CN)

(73) Assignee: Chiphomer Technology Limited, Shanghai (CN)

( * ) Notice: Subject to any disclaimer, the term of this patent is extended or adjusted under 35 U.S.C. 154(b) by 129 days.

(21) Appl. No.: 12/186,791

(22) Filed: Aug. 6, 2008

(65) Prior Publication Data

US 2009/0108914 A1    Apr. 30, 2009

(30) Foreign Application Priority Data

Oct. 31, 2007   (CN) .......................... 2007 1 0047637

(51) Int. Cl.
*H03K 17/945* (2006.01)
(52) U.S. Cl. .................. 327/517; 324/658; 340/562
(58) Field of Classification Search .................. 327/517
See application file for complete search history.

(56) References Cited

U.S. PATENT DOCUMENTS

| | | | |
|---|---|---|---|
| 2004/0217886 A1* | 11/2004 | Horton et al. ................. 341/33 |
| 2005/0001633 A1* | 1/2005 | Okushima et al. ........... 324/658 |
| 2006/0055416 A1* | 3/2006 | Kinoshita et al. ............ 324/658 |
| 2006/0097991 A1 | 5/2006 | Hotelling et al. |
| 2008/0297205 A1* | 12/2008 | Taylor .......................... 327/97 |
| 2009/0073140 A1* | 3/2009 | Fujita et al. .................. 345/174 |
| 2009/0089605 A1* | 4/2009 | Westwick et al. ............ 713/340 |
| 2009/0322410 A1* | 12/2009 | David et al. .................. 327/517 |

* cited by examiner

*Primary Examiner*—Lincoln Donovan
*Assistant Examiner*—Ryan C Jager
(74) *Attorney, Agent, or Firm*—Wolf, Greenfield & Sacks, P.C.

(57) ABSTRACT

An adaptive capacitive touch sense control circuit includes a voltage buffer, a current setting resistor, a current mirror, a capacitor, a start comparator, an end comparator and a time-to-digital converter. The capacitor is connected with the current setting resistor. The circuit further includes a latch with a first control switch and a second control switch. The current setting resistor is switched between the ground and a voltage source through a switching element, so that when the current setting resistor is grounded, the first control switch is closed and the second control switch is opened, and when the current setting resistor is connected with the voltage source, the second control switch is closed and the first control switch is opened. An adaptive charging mode is adopted to sense a capacitance variation with a great ability of interference recognition, a simple structure, low power consumption and real time processing.

12 Claims, 10 Drawing Sheets

ADAPTIVE CAPACITIVE TOUCH SENSE CONTROL CIRCUIT

FIELD OF THE INVENTION

The present invention relates to an adaptive capacitive touch sense control circuit.

BACKGROUND OF THE INVENTION

A capacitive touch sensor is applicable to any existing product using a traditional mechanical switch, especially to a small portable product, such as menu control buttons of a fresh model of mobile phone or media player. Reliable and cost effective capacitive touch sensors can be used to change the style of these advanced menu control switches easily so as to offer users a fully new feeling in operation. Application of capacitive touch sensors in a white appliance can prevent water and oil from eroding press keys and the appliance per se so as to improve user-friendliness and safety of the appliance. A further advantage of the replacement of traditional mechanical switches by capacitive touch sensors is more simplified manufacturing and assembling processes. The traditional mechanical switches each have to be inserted manually into a special hole in a plastic casing, while a single capacitive touch sensor board incorporating all these switches can be disposed in place below the plastic casing in one step. A mounting hole for the sensor board, which incorporates a locating slot, and some glue are sufficient to mount and align the sensor board in place. As mixed signal technologies advance, capacitive touch sensors have become a practical and value-added alternative to mechanical switches in various electronic products.

A simple parallel-plate capacitor is provided with two plates as illustrated in FIG. 12a. The two plates are separated by a dielectric layer, and thus there is an inherent sensor capacitance $C_{SENSOR}$ between the upper and lower plates. The sensor capacitance here refers to an inherent capacitance of the touch plate relative to the ground before the plate is touched. When a human finger touches the plate as illustrated in FIG. 12b, the human body is equivalent to the ground and the area of the plate relative to the ground is increased, resulting in a capacitance increase $\Delta C$ denoted with the broken line in the figure.

The operation principle of a capacitive touch sensor lies in sensing and converting this capacitance increase $\Delta C$ into data to be processed by a processor. A charge transfer method, a relaxation oscillation counting method and a sigma-delta Analogue-to-Digital Conversion (ADC) method are used for existing capacitive touch sensors and have their own advantages, but they generally have the drawbacks of a complex structure, large power consumption, time-consuming processing, a large number of peripheral elements and a limited ability in interference recognition. Touch sensors charged with a constant current source or constant voltage source are widely applied at present.

A capacitive touch sense control circuit based upon a constant current source charging principle as illustrated in FIG. 1 includes a current setting resistor 101, a pad capacitor 102, a start comparator 103, an end comparator 104, a Time-to-Digital Converter (TDC) 105, a voltage buffer 106 and a current mirror 107. In particular, $C_S$ is a total capacitance at the pad including a parasitic capacitance and a sensor capacitance at the pad of a chip. A reference voltage $V_{REF}$ results in a reference current $I_1$ through the voltage buffer 106 and the current setting resistor 101. The voltage buffer 106 includes an error amplifier and a source followed NMOS transistor. $I_1$ is converted by the current mirror 107 into a charging current $I_2$ to charge the capacitor. When the capacitor pad reaches a nominal level $V_{STA}$, the start comparator 103 is inverted and the Time-to-Digital Converter (TDC) 105 starts to count. When the capacitor pad reaches a higher nominal level $V_{END}$, the end comparator 104 is inverted and the TDC stops counting. This interval of time is converted into data to be delivered to and processed by a processor.

From $Q=I*t=U*C$, the following formulae can be derived:

$$T1 = (V_{END} - V_{STA})C_S/I_2$$

$$I_2 = mI_1 = mV_{REF}/R_S$$

$$T1 = R_S C_S *(V_{END} - V_{STA})/mV_{REF}$$

where m is a mirror coefficient of the current mirror, and the voltages $V_{END}$, $V_{STA}$ and $V_{REF}$ are generated by dividing the same reference voltage, so $(V_{END} - V_{STA})/mV_{REF}$ is a constant, denoted with $\beta$.

$$T1 = \beta R_S C_S$$

$$T2 = \beta R_S (\Delta C + C_S)$$

$$\Delta T = T2 - T1 = \beta R_S \Delta C$$

FIG. 2 illustrates this charging process depicting a charging curve L1 before the sensor capacitance varies and a charging curve L2 after the sensor capacitance varies.

A capacitive touch sense control circuit based upon a constant voltage source charging principle as illustrated in FIG. 3 includes a current setting resistor 101, a pad capacitor 102, a start comparator 103, an end comparator 104 and a Time-to-Digital Converter (TDC) 105. In particular, $C_S$ is a total capacitance at the pad including a parasitic capacitance and a sensor capacitance at the pad of a chip. A charging voltage VDD results in a reference current $I_1$ through the current setting resistor 101 to charge the capacitor. When the capacitor pad reaches a nominal level $V_{STA}$, the start comparator 103 is inverted and a Time-to-Digital Converter (TDC) 105 starts to count. When the capacitor pad reaches a higher nominal level $V_{END}$, the end comparator 104 is inverted and the TDC stops counting. This interval of time is converted into data to be delivered to and processed by a processor.

From $U_t/U0 = e^{-t/(RC)}$, the following formulae can be derived:

$$T1 = R_S C_S (\ln V_{END} - \ln V_{STA})$$

The voltages $V_{END}$ and $V_{STA}$ are generated by dividing the same reference voltage, so $(\ln V_{END} - \ln V_{STA})$ is a constant, denoted with $\alpha$.

$$T1 = \alpha R_S C_S$$

$$T2 = \alpha R_S (\Delta C + C_S)$$

$$\Delta T = T2 - T1 = \alpha R_S \Delta C$$

FIG. 4 illustrates this charging process depicting a charging curve L1 before the sensor capacitance varies and a charging curve L2 after the sensor capacitance varies.

External electromagnetic variations may cause very often a capacitance variation of a capacitor, and an abnormal variation of the capacitor may influence the normal operation of the capacitive touch sense control circuit. Since external interferences vary differently, the constant current source charging mode is sometimes more effective for interference recognition than the constant voltage source charging mode while the latter is more effective than the former at other times. The problem to be addressed by the invention is how to provide both the constant voltage source charging mode and the constant voltage source charging mode for the purpose of more effective interference recognition.

Further, in practical applications, a hand touch may give rise to a capacitance variation of approximately 1 pF, i.e., $\Delta C=1$ pF. The parasitic capacitance at the pad of a chip is approximately 10 pF, the external sensor capacitance is approximately 5 pF, and the reading of $\Delta T$ is only $\frac{1}{16}$ of that of T2. In some cases, the pad parasitic capacitance and sensor capacitance may be larger while the capacitance variation resulting from a hand touch may be smaller. A more advanced application such as slide sensing or absolute position determination requires a relatively large reading obtained from this tiny capacitance variation, which requires a high precision in sensing the capacitance variation. Unfortunately, the setting resistor can not be set too large because too small a current is vulnerable to any interference, and the reading of the TDC also is limited in terms of the number of digits. Consequently, it is difficult to realize a high precision in sensing a capacitance variation in the existing capacitive touch sense control circuit structures with a large value of the inherent capacitance.

SUMMARY OF THE INVENTION

An object of the invention is to provide an adaptive capacitive touch sense control circuit which can select a capacitor charging mode adaptively in response to the external environment so as to achieve a greater ability in interference recognition.

In order to attain the above object, technical solutions of the invention are as follows.

An adaptive capacitive touch sense control circuit includes a voltage buffer, a current setting resistor, a current mirror, a capacitor, a start comparator, an end comparator and a time-to-digital converter, with the voltage buffer being connected with the current setting resistor and the current mirror, the capacitor being connected with the current mirror, the start comparator and the end comparator, and the start comparator and the end comparator being connected with the time-to-digital converter, wherein the capacitor is connected with the current setting resistor; the control circuit further includes a latch provided with a first control switch between the capacitor and the current mirror and between the voltage buffer and the current setting resistor and a second control switch between the capacitor and the current setting resistor; and the current setting resistor is switched between the ground and a voltage source through a switching element, so that when the current setting resistor is grounded, the first control switch is closed and the second control switch is opened, and when the current setting resistor is connected with the voltage source, the second control switch is closed and the first control switch is opened.

With the circuit structured above, opened or closed status of the first and second control switches is controlled with a high or low level of the latch. When the current setting resistor is grounded, the circuit is in a constant current charging mode, and when the current setting resistor is connected with the voltage source, the current is in a constant voltage charging mode. When the reference capacitance pad reaches a nominal comparison level $V_{COMP}$, the start comparator is inverted and the Time-to-Digital Converter (TDC) starts to count, and when the sensor capacitance pad reaches $V_{COMP}$, the end comparator 305 is inverted and the TDC stops counting. This interval of time is converted into data to be delivered to and processed by a processor. A touch capacitance variation can be sensed with use of the constant current/voltage source adaptive charging principle so as to sense an amount of the capacitance variation in an adaptive charging mode with a great ability in interference recognition, a simple structure, low power consumption, real time processing and a small number of peripheral elements.

DETAILED DESCRIPTION OF THE INVENTION

Preferred embodiments of the invention will be given and described in details hereinafter with reference to FIG. 5 to FIG. 11 to provide a better understanding of the functions and features of the invention.

Figure 5:
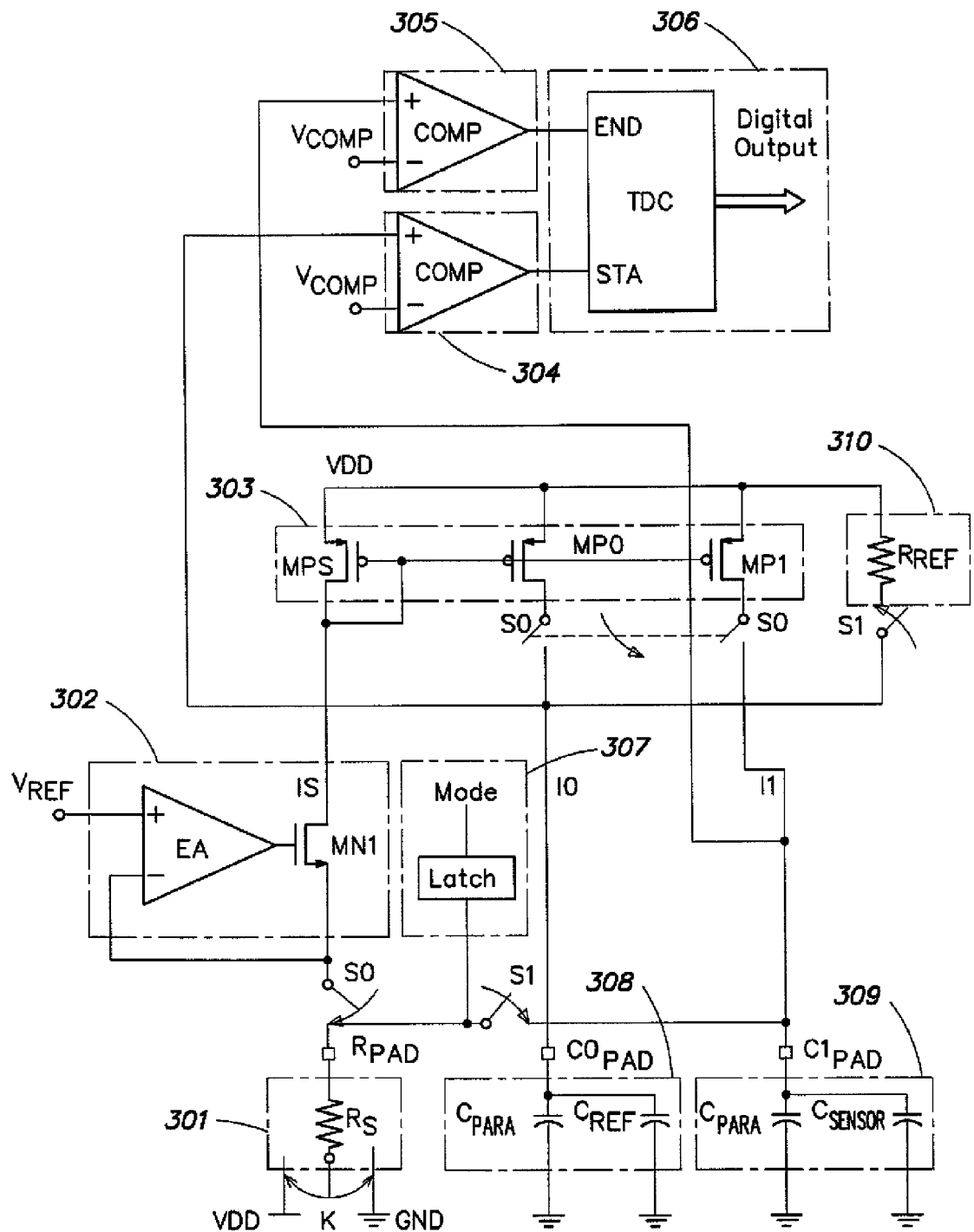
FIG. 5 is an adaptive capacitive touch sense control circuit according to an embodiment of the invention.

As illustrated in FIG. 5, an embodiment of the invention provides an adaptive capacitive touch sense control circuit including a current setting resistor 301, a voltage buffer 302, a current mirror 303, a start comparator 304, an end comparator 305, a Time-to-Digital Converter (TDC) 306, a latch 307, a reference pad equivalent capacitor 308, a sensor pad equivalent capacitor 309, a reference through resistor 310 and switches S0 and S1 controlled by the latch.

The sensor pad equivalent capacitor 309 includes a parasitic capacitor $C_{PARA}$ and a sensor capacitor $C_{SENSOR}$. The reference pad equivalent capacitor 308 includes a parasitic capacitor $C_{PARA}$ and a reference capacitor $C_{REF}$ with a value which shall be below that of the sensor capacitor $C_{SENSOR}$.

When the K terminal of $R_S$ is grounded, the latch is in the status of zero (low), and at this time the circuit is in a constant current source charging mode. The schematic diagram may be simplified as FIG. 6. The reference voltage $V_{REF}$ results in a reference current $I_S$ through the voltage buffer 302 and the current setting resistor 301, and the voltage buffer includes an error amplifier and a source followed NMOS transistor. $I_S$ is converted by the current mirror 303 into two equal charging currents $I_0$ and $I_1$ to charge the sensor capacitor $C_{SENSOR}$ and the reference capacitor $C_{REF}$ concurrently. When the reference capacitance pad reaches a nominal comparison level $V_{COMP}$, the start comparator 304 is inverted and the Time-to-Digital Converter (TDC) 306 starts to count, and when the sensor capacitance pad reaches $V_{COMP}$, the end comparator 305 is inverted and the TDC stops counting. This interval of time is converted into data to be delivered to and processed by a processor.

Capacitance values are converted into temporal magnitudes which are in turn converted into data for processing. If the value of the sensor capacitance varies, TDC data from two samples result in a time difference $\Delta T$ reflecting the variation of the sensor capacitance.

$$T1 = V_{COMP}(C_{SENSOR} - C_{REF})/I_0$$

$$I0 = mI_S = mV_{REF}/R_S$$

$$T1 = R_S(C_{SENSOR} - C_{REF})V_{COMP}/mV_{REF}$$

where m is a mirror coefficient of the current mirror, and the voltages $V_{COMP}$ and $V_{REF}$ are generated by dividing a reference voltage, so that $V_{COMP}/mV_{REF}$ is a constant, denoted with K.

$$T1 = KR_S(C_{SENSOR} - C_{REF})$$

$$T2 = KR_S(\Delta C + C_{SENSOR} - C_{REF})$$

$$\Delta T = T2 - T1 = KR_S \Delta C$$

Figure 7:
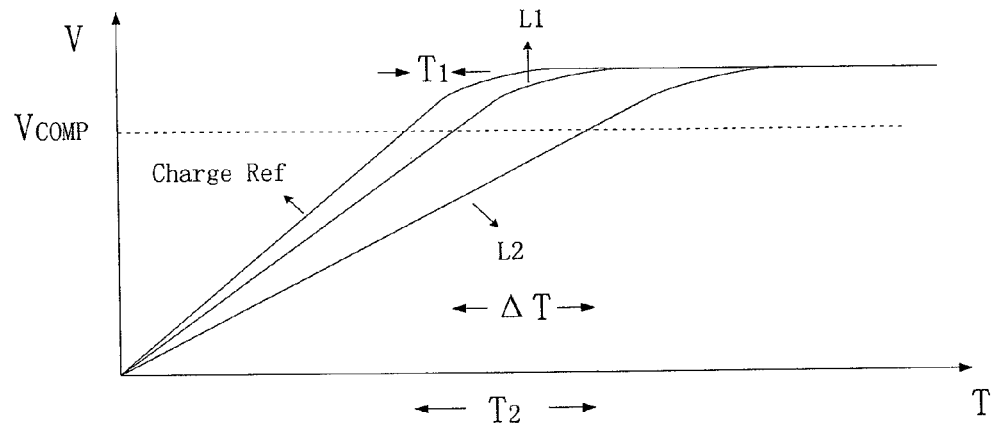
FIG. 7 shows an operation timing waveform of the circuit in FIG. 6.

FIG. 7 illustrates this charging process. Since the reference pad equivalent capacitor is small, Charge Ref reaches the comparison level $V_{COMP}$ first and the TDC starts to count. When the sensor pad voltage is charged to $V_{COMP}$ (see L1), the TDC stops counting at T1. When the capacitance varies, the above process is repeated, where L2 denotes the sensor pad voltage and the reading of the TDC is T2. The difference of the measured time, $\Delta T = T2 - T1$, reflects the variation of the capacitance.

Assuming that the parasitic capacitance is 10 pF, the sensor capacitance is 5 pF and $\Delta C$ is 1 pF, the reading of $\Delta T$ is ⅔ of that of T2.

When the K terminal of Rs 301 is connected to VDD, the circuit is in a constant voltage charging mode. At this time, VDD charges the sensor capacitor and the reference capacitor respectively via the resistors $R_S$ and $R_{REF}$. When the reference capacitance pad reaches a nominal comparison level $V_{COMP}$, the start comparator 304 is inverted and the Time-to-Digital Converter (TDC) 306 starts to count, and when the sensor capacitance pad reaches $V_{COMP}$, the end comparator 305 is inverted and the TDC stops counting. This interval of time is converted into data to be delivered to and processed by a processor. The capacitance values are converted into temporal magnitudes which are in turn converted into data for processing. If the value of the sensor capacitor varies, TDC data from two samples result in a time difference $\Delta T$ reflecting the variation of the sensor capacitance.

$$T1 = (R_S C_{SENSOR} - R_{REF} C_{REF}) \ln(VDD/V_{COMP})$$

where the voltages VDD and $V_{COMP}$ are generated by dividing a reference voltage, so that $\ln(VDD/V_{COMP})$ is a constant, denoted with L.

$$T1 = L(R_S C_{SENSOR} - R_{REF} C_{REF})$$

$$T2 = L(R_S \Delta C + R_S C_{SENSOR} - R_{REF} C_{REF})$$

$$\Delta T = T2 - T1 = L R_S \Delta C$$

As can be seen from the above derivations, figures and formulae, the pad parasitic capacitor is counteracted completely and an excessively large sensor capacitor $C_{SENSOR}$ can also be counteracted greatly by setting a reasonable reference capacitor $C_{REF}$. The variation amount $\Delta C$ of the sensor capacitance occupies a large proportion of the parasitic capacitance and thus a tiny variation of the capacitance can result in a large TDC reading, thereby realizing a high precision in sensing the capacitance variation.

In the above structure of an adaptive capacitive touch sense control circuit, an input terminal of the latch is connected with $R_S$, and the level of the K terminal of $R_S$ is detected to thereby enable the operating circuit to select a constant current or voltage source charging mode adaptively.

In the above circuit, a current setting resistor delivers a low or high level to the latch when being connected with the ground or VDD, a reference capacitor connects the reference capacitor pad to the ground, and a sensor capacitor connects the sensor capacitor pad to the ground.

In the above circuit, in the constant current source charging mode, the charging currents of the capacitors are generated by the voltage buffer, the reference voltage, an external resistor and the current mirror. The charging currents of the reference capacitor and the sensor capacitor are equal.

In the above circuit, in the constant voltage charging mode, the charging voltages of the capacitors are VDD which charges the reference capacitor and the sensor capacitor respectively via $R_{REF}$ and $R_S$. At this time, the charging voltages of the reference capacitor and the sensor capacitor are equal.

In the above circuit, one comparator and the reference capacitor determine a start time of the TDC, and the other comparator and the sensor capacitor determine an end time of the TDC.

In the above circuit, the capacitance value is converted into a temporal magnitude dependent upon only a product of the resistance value and the capacitance value and independent of the voltage and the current.

In the above circuit, an appropriate reference capacitor is set in a way that during capacitance measurement, the inherent parasitic capacitance and sensor capacitance at the pad are counteracted greatly to increase the proportion of a reading of the capacitance variation amount and thus to improve the sensing precision.

A logic table for controlling S0/S1 by the latch is shown as follows.

| LATCH | S0/S1 status | Charging mode |
| --- | --- | --- |
| 0 (low level) | S0 closed, S1 opened | Constant current source |
| 1 (high level) | S0 opened, S1 closed | Constant voltage source |

When the K terminal of $R_S$ is grounded, the level of the latch is 0 (low), and according to the table, S0 is closed and S1 is opened in the circuit. At this time the circuit is in a constant current charging mode. When the K terminal of $R_S$ is connected with VDD, the level of the latch is 1 (high), and according to the table, S0 is opened and S1 is closed in the circuit. At this time the circuit is in a constant voltage charging mode.

Figure 6:
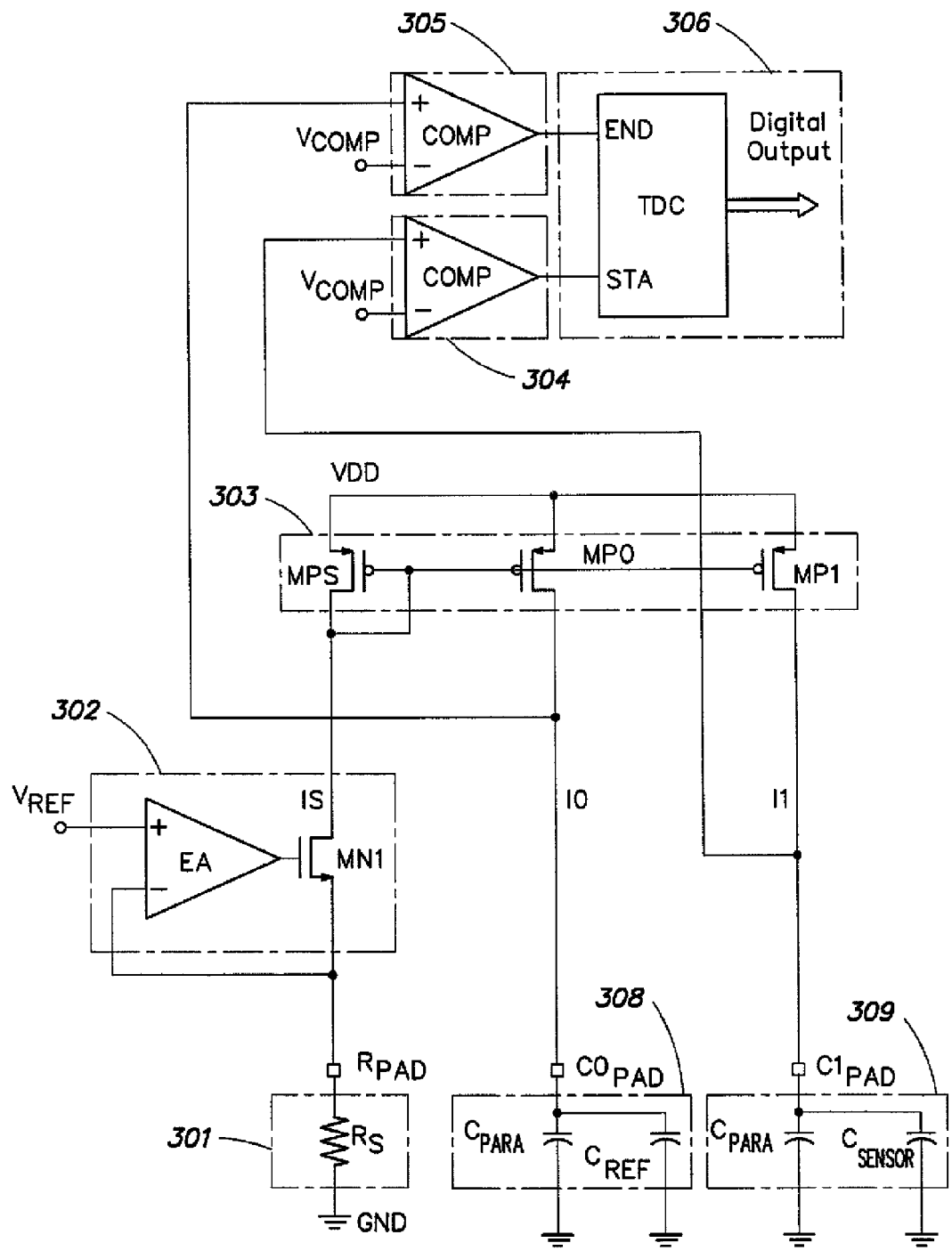
FIG. 6 is a simplified schematic diagram illustrating a capacitive touch sense control circuit when the circuit is adapted to a constant current source according to an embodiment of the invention.
Figure 8:
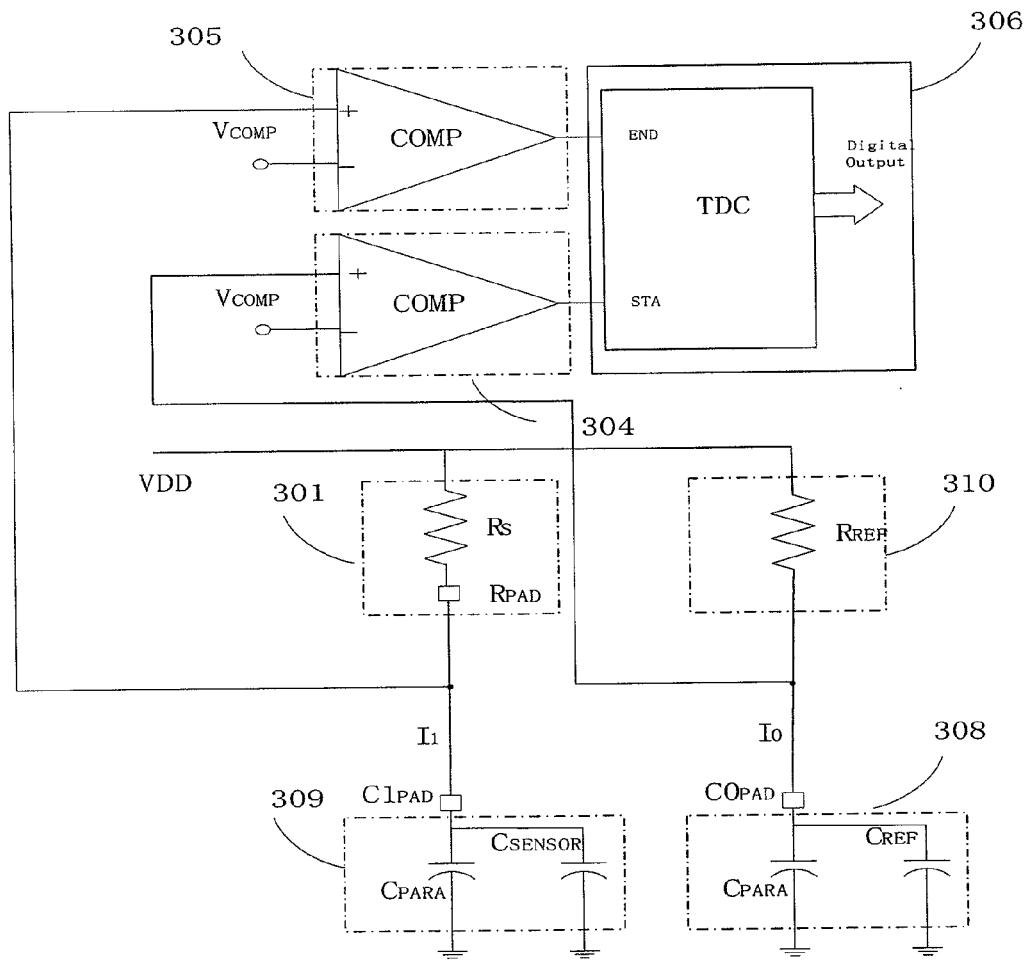
FIG. 8 is a simplified schematic diagram illustrating a capacitive touch sense control circuit when the circuit is adapted to a constant voltage source according to an embodiment of the invention.
Figure 9:
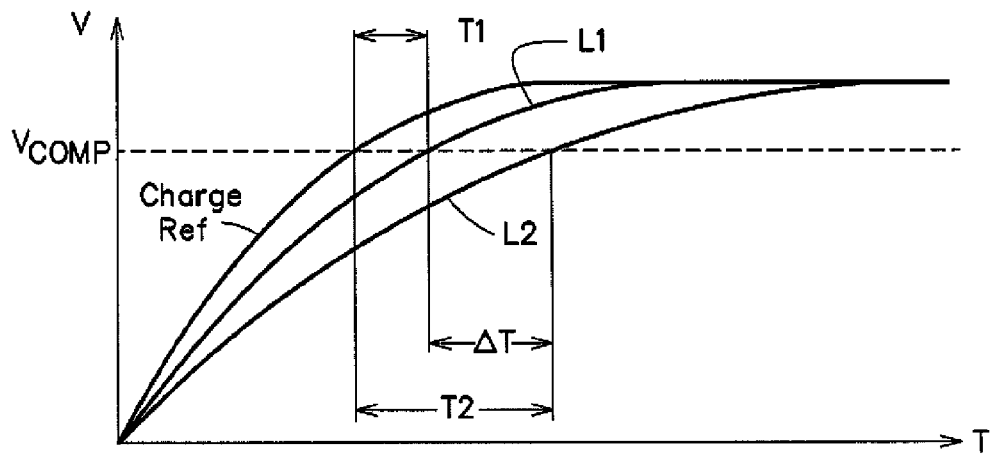
FIG. 9 shows an operation timing waveform of the circuit in FIG. 8.

The temporal magnitude T1 illustrated in FIG. 6 and FIG. 8 is converted into data D1, also referred to as a baseline. Touch of a human hand causes the capacitance to vary, the resultant T2 is converted into data D2, and the difference ΔD between D2 and D1 is processed as an operative key press. Practical applications may deviate from the above ideal cases. Specifically, since the sensor capacitor may vary with the external environment, for example, such conditions as temperature, humidity, etc., the baseline may fluctuate. In addition, ΔD may vary with different persons or different dry or humid degrees of fingers. It is therefore necessary for the processor to conduct special processing on the data so that whether a touch occurs can be recognized properly with exclusion of an external interference (the data may be processed with technologies of baseline tracking, threshold decision, multiple averaging, etc., which are not the focus of the invention and therefore will not be described here in detail).

Figure 10:
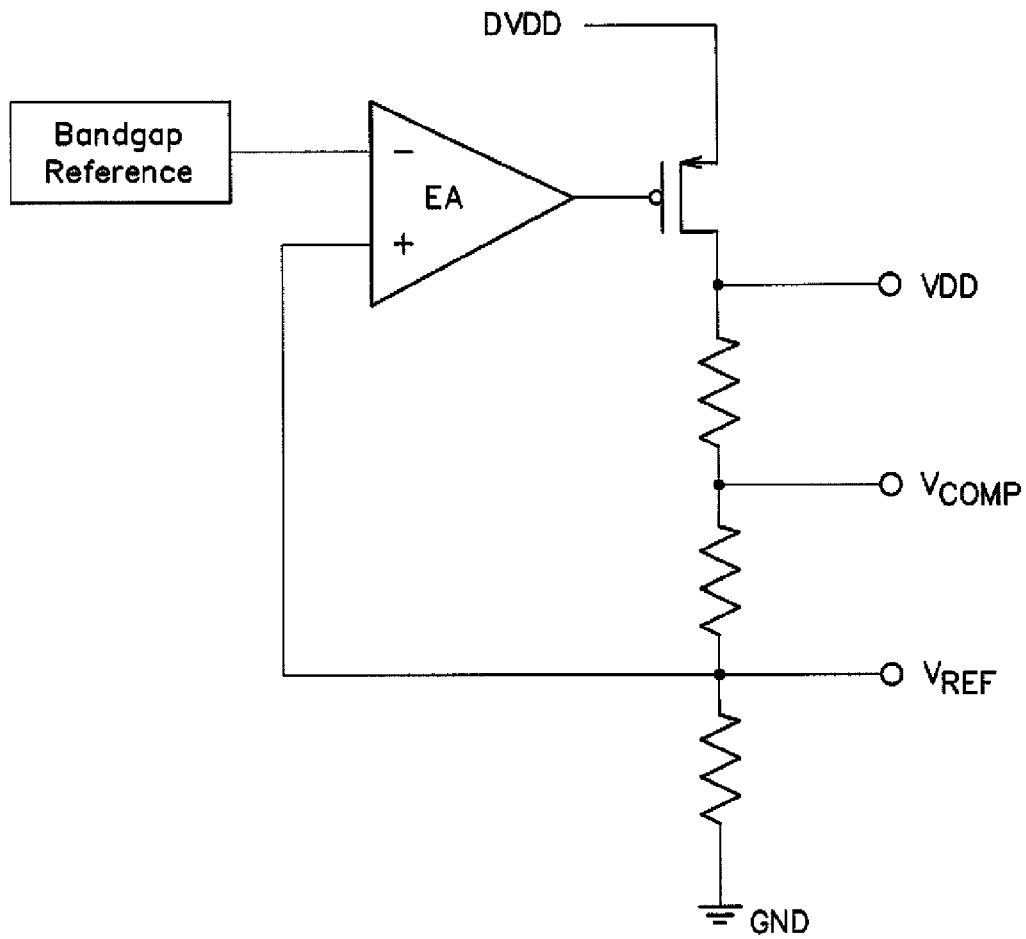
FIG. 10 is a schematic diagram illustrating a Low Dropout (LDO) regulator for generating an operation voltage and a reference voltage according to an embodiment of the invention.

In practical applications, considering that the two reference voltages $V_{REF}$ and $V_{COMP}$ are needed in the structure of the circuit and the fluctuation of the source voltage VDD may also interfere with the charging current and the TDC, an LDO structure illustrated in FIG. 10 is introduced to isolate the interference from an external source DVDD and thus to provide a clear and stable internal source VDD. The two reference voltages $V_{REF}$ and $V_{COMP}$ are generated for the voltage buffer and the comparators by dividing a reference voltage.

Figure 11:
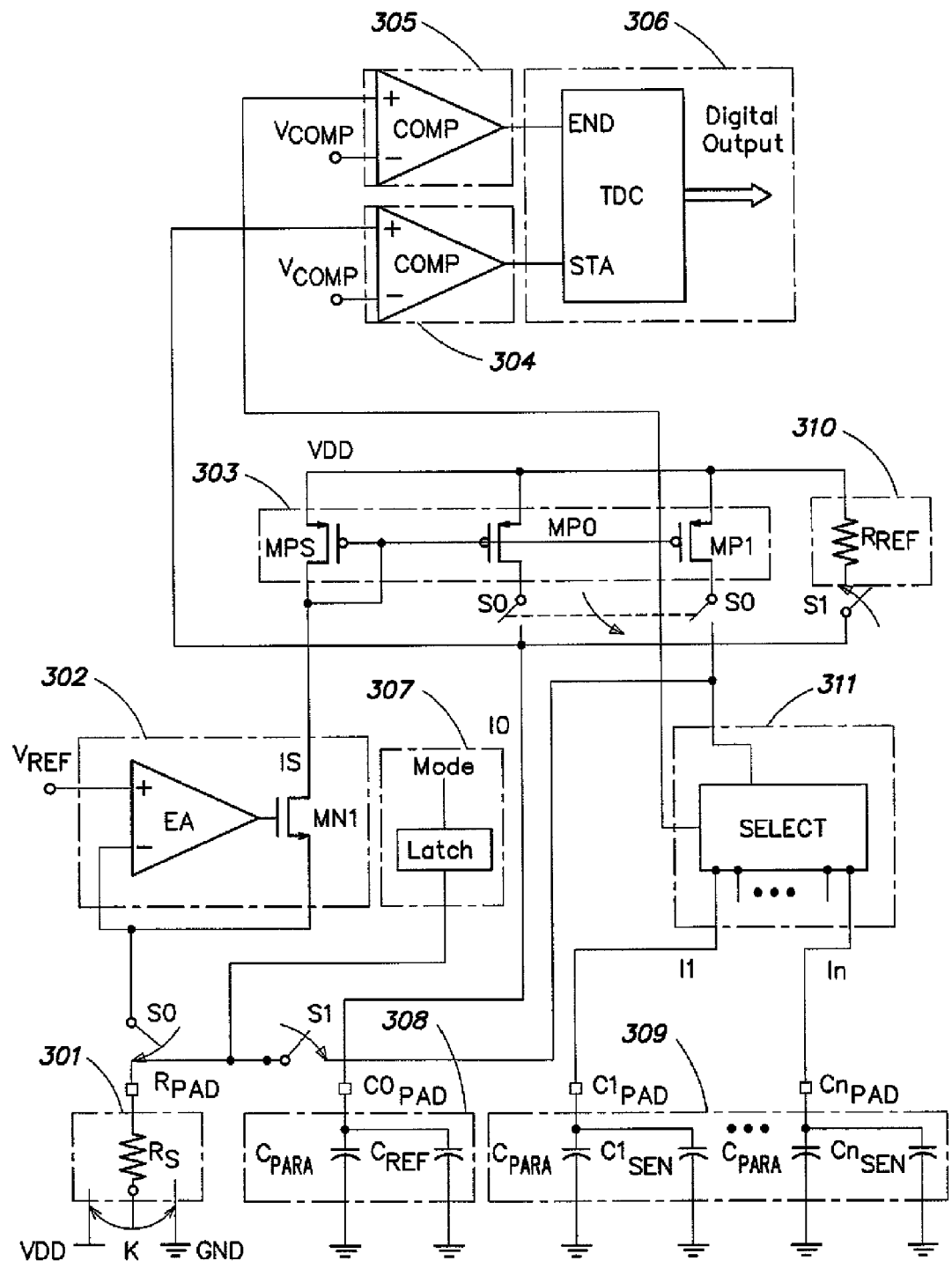
FIG. 11 is a schematic diagram illustrating a high-precision multi-path capacitive touch sense control circuit to which the invention is applied.
Figure 12A:
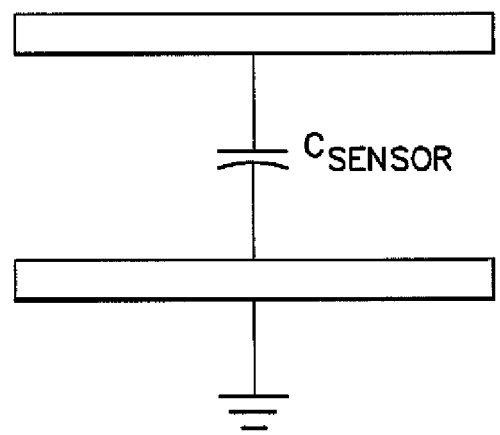
FIG. 12a and FIG. 12b are schematic diagrams illustrating a sensor capacitance variation due to a touch.
Figure 12B:
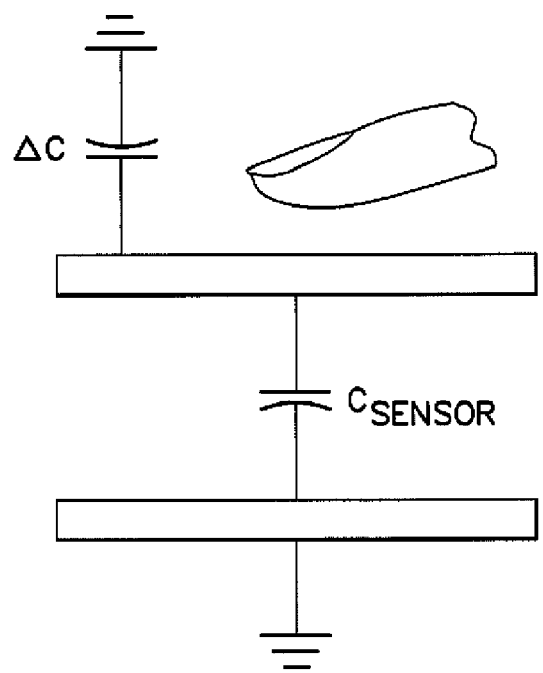

FIG. 11 illustrates a high-precision multi-path capacitive touch sense control circuit including a current setting resistor 301, a voltage buffer 302, a multi-path current mirror 303, a start comparator 304, an end comparator 305, a Time-to-Digital Converter (TDC) 306, a latch 307, a reference pad equivalent capacitor 308, a number of sensor pad equivalent capacitors 309, a reference through resistor 310 and a 1-of-n selector 311. The 1-of-n selector 311 selects one sensor capacitor path at a time, that is, only one charging path is taken for the end signal at a certain point of time. The operation principle for the other components is as described with reference to the circuit structure illustrated in FIG. 5.

Figure 1:
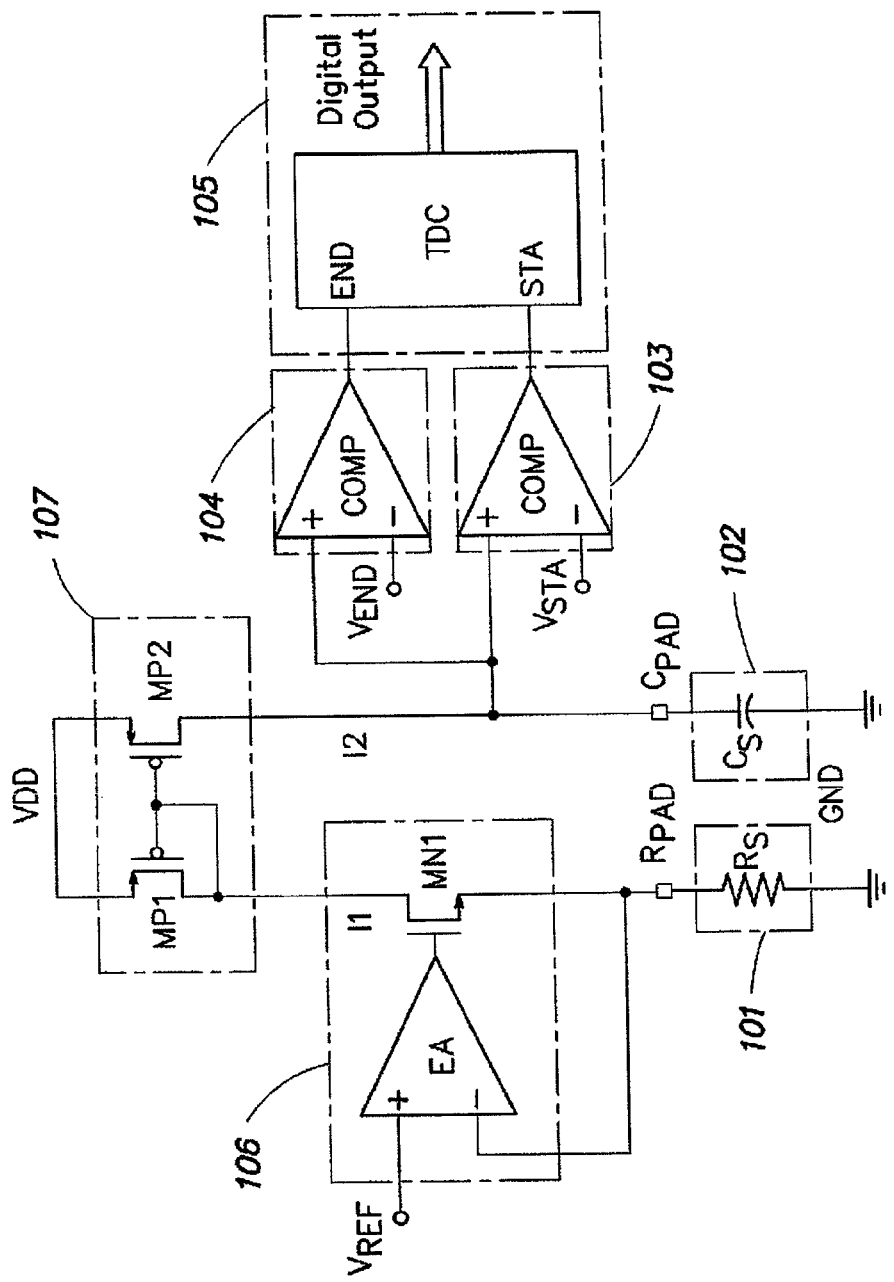
FIG. 1 is a schematic diagram illustrating the structure of an existing capacitive touch sense control circuit with a constant current source.
Figure 2:
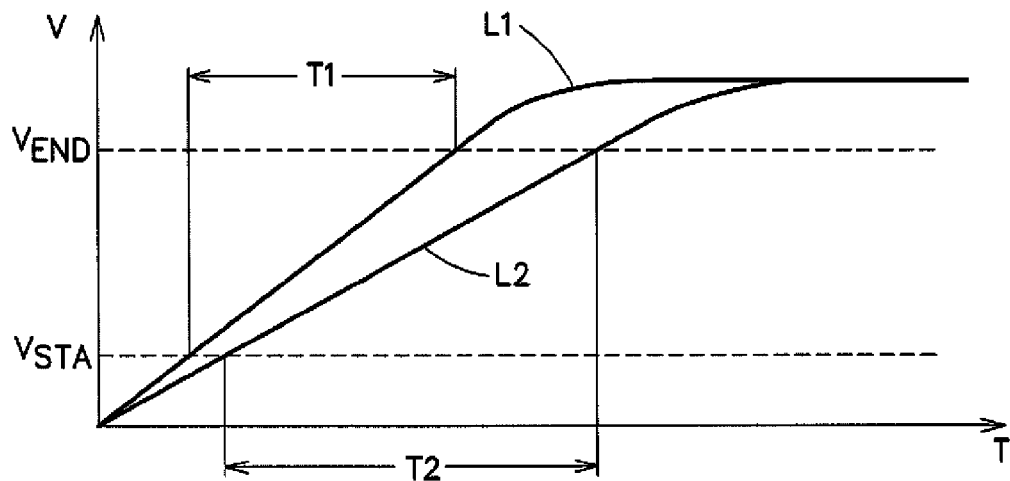
FIG. 2 shows an operation timing waveform of the existing capacitive touch sense control circuit with a constant current source.
Figure 4:
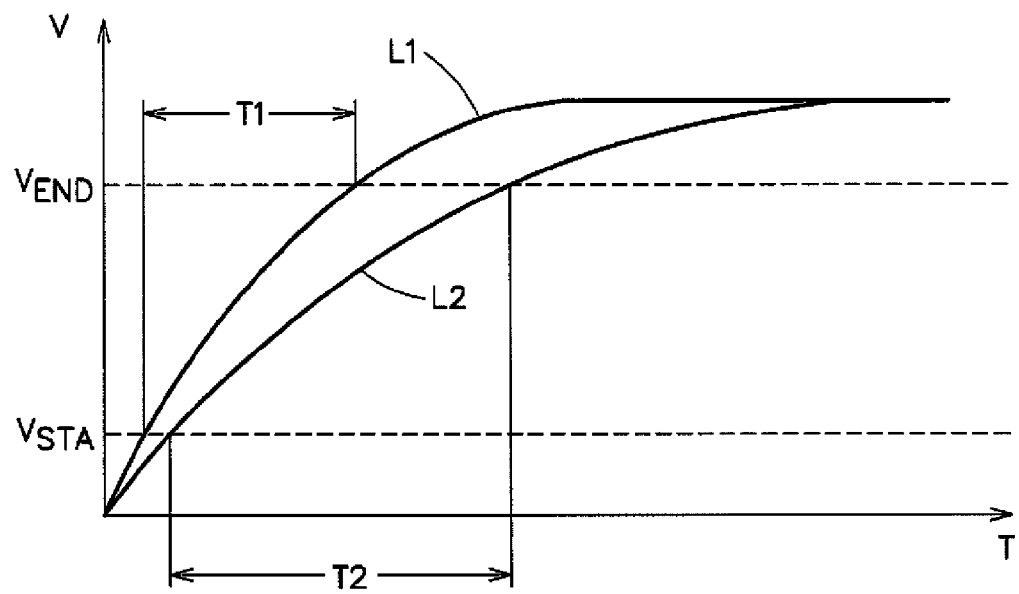
FIG. 4 shows an operation timing waveform of the existing capacitive touch sense control circuit with a constant voltage source.
Figure 3:
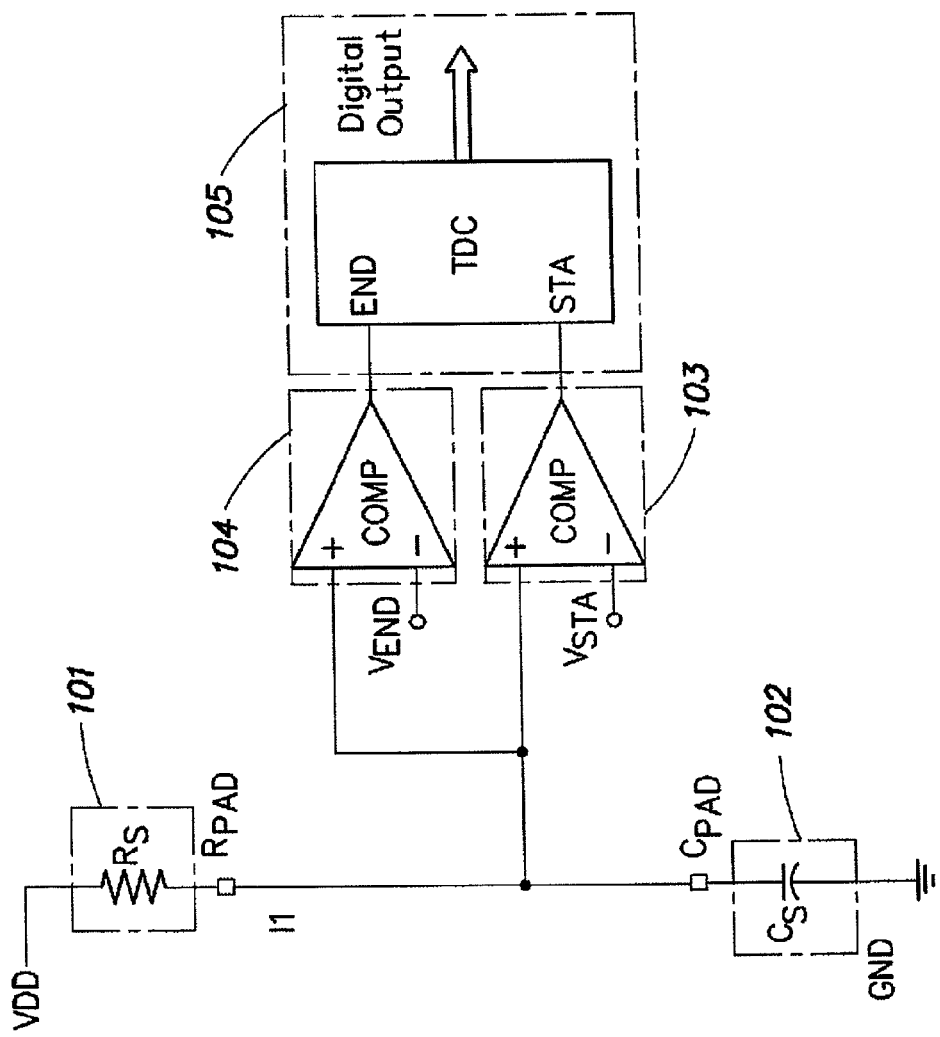
FIG. 3 is a schematic diagram illustrating the structure of an existing capacitive touch sense control circuit with a constant voltage source.
Figure 13:
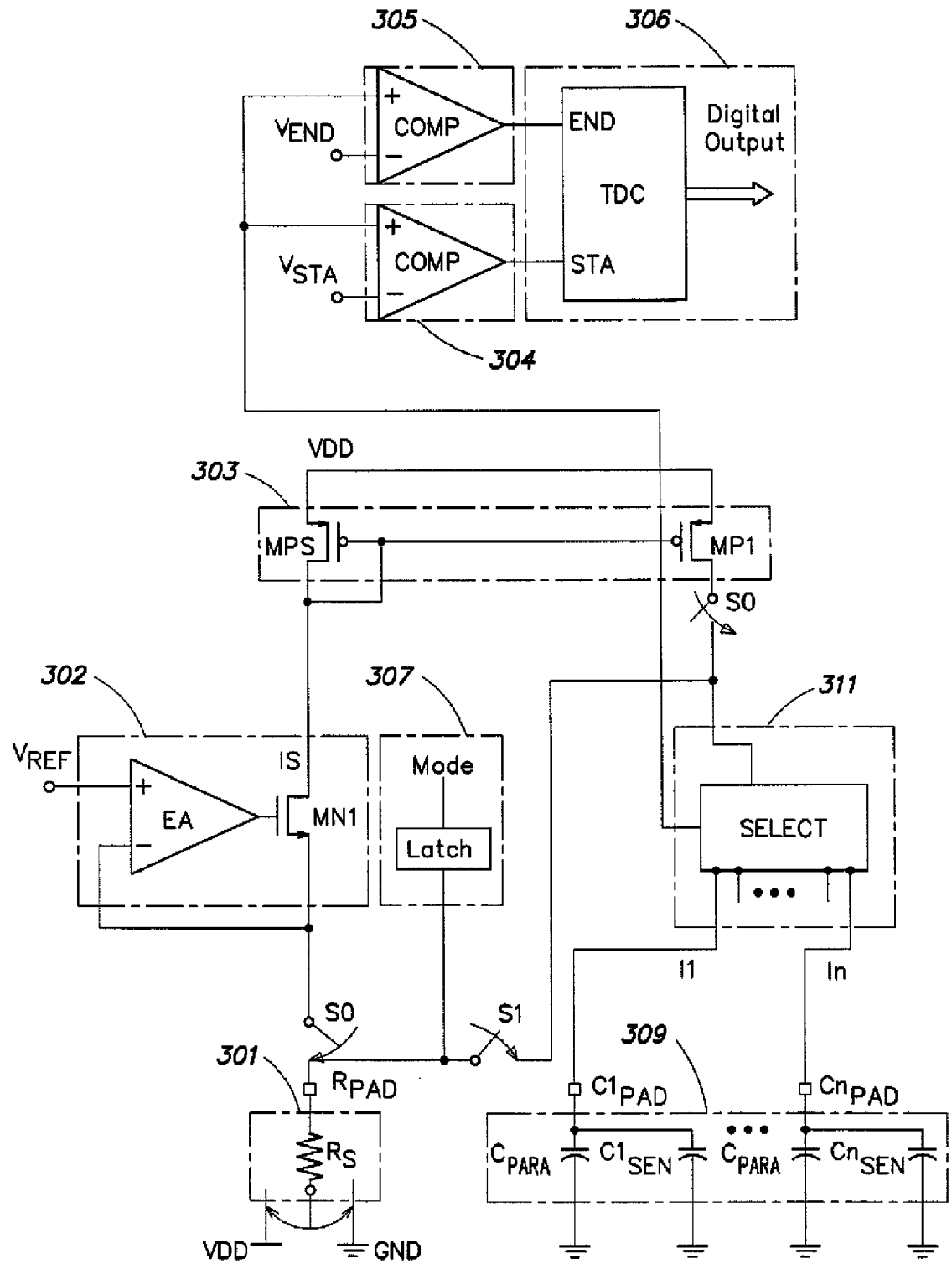
FIG. 13 is a schematic diagram illustrating a general multi-path capacitive touch sense control circuit to which the invention is applied.

FIG. 13 illustrates a general multi-path capacitive touch sense control circuit including a current setting resistor 301, a voltage buffer 302, a current mirror 303, a start comparator 304, an end comparator 305, a Time-to-Digital Converter (TDC) 306, a latch 307, a number of sensor pad equivalent capacitors 308 and a 1-of-n selector 309. The 1-of-n selector 309 selects one sensor capacitor path at a time, that is, charge or discharge takes place in only one charging path at a certain point of time. The operation principle is as described with reference to the circuit structure illustrated in FIG. 1 when $R_S$ is connected with GND and is as described with reference to the circuit structure illustrated in FIG. 3 when $R_S$ is connected with VDD.

The embodiments of the invention have the following advantages.

1. A level of the latch is configured through $R_S$ to select a constant current or voltage source charging mode adaptively for the inventive capacitor sensor with a great ability of interference recognition, a simple circuit structure, low power consumption, real time processing and a small number of peripheral elements.

2. Resistance and capacitance values are converted into a temporal magnitude dependent upon only the product of the resistance and capacitance values and independent of a source voltage and a reference voltage. The sensing precision can be adjustable by adjusting an external resistor.

3. An appropriate reference capacitor is set in a way that during capacitance measurement, the inherent parasitic capacitance and sensor capacitance at a pad are counteracted greatly to increase the proportion of a reading of the capacitance variation amount and thus to improve the sensing precision.

The foregoing descriptions are merely illustrative of the preferred embodiments of the invention to enable any skilled in the art to practice the invention. Those skilled in the art can make various modifications or variations to the preferred embodiments without departing from the scope of the invention and it shall be appreciated that these modifications or variations will still fall within the scope of the invention as defined in the appended claims.

We claim:

1. An adaptive capacitive touch sense control circuit, comprising a voltage buffer, a current setting resistor, a current mirror, two capacitors, a start comparator, an end comparator and a time-to-digital converter, with the voltage buffer being connected with the current setting resistor and the current mirror, the two capacitors being connected with the current mirror, the start comparator and the end comparator, and the start comparator and the end comparator being connected with the time-to-digital converter, wherein one of the two capacitors is connected with the current setting resistor; the control circuit further comprises a latch provided with a first control switch between the capacitor and the current mirror and between the voltage buffer and the current setting resistor and a second control switch between one of the two capacitors and the current setting resistor, the latch is connected with the first control switch; and the current setting resistor is switched between ground and a voltage source through a switching element, so that when the current setting resistor is grounded, the first control switch is closed and the second control switch is opened, and when the current setting resistor is connected with the voltage source, the second control switch is closed and the first control switch is opened.

2. The adaptive capacitive touch sense control circuit according to claim 1, wherein the two capacitors comprise a reference pad equivalent capacitor connected with the start comparator and a sensor pad equivalent capacitor connected with the end comparator.

3. The adaptive capacitive touch sense control circuit according to claim 2, further comprising a selector and a plurality of sensor pad equivalent capacitors connected with the selector, wherein the selector selects one capacitor path at a time.

4. The adaptive capacitive touch sense control circuit according to claim 2, wherein the sensor pad equivalent capacitor comprises a first parasitic capacitor and a sensor capacitor connected in parallel; the reference pad equivalent capacitor comprises a second parasitic capacitor and a reference capacitor connected in parallel; and the reference capacitor has a value below that of the sensor capacitor.

5. The adaptive capacitive touch sense control circuit according to claim 4, wherein when the current setting resistor is grounded, charging currents of the reference capacitor and the sensor capacitor are equal.

6. The adaptive capacitive touch sense control circuit according to claim 5, further comprising a selector and a plurality of sensor pad equivalent capacitors connected with the selector, wherein the selector selects one capacitor path at a time.

7. The adaptive capacitive touch sense control circuit according to claim 4, wherein the reference pad equivalent capacitor is connected with the voltage source via the second control switch and a reference resistor; and when the current setting resistor is connected with the voltage source, the voltage source charges the reference capacitor and the sensor capacitor respectively with equal charging voltages via the reference resistor and the current setting resistor.

8. The adaptive capacitive touch sense control circuit according to claim 7, further comprising a selector and a plurality of sensor pad equivalent capacitors connected with the selector, wherein the selector selects one capacitor path at a time.

9. The adaptive capacitive touch sense control circuit according to claim 4, further comprising a selector and a plurality of sensor pad equivalent capacitors connected with the selector, wherein the selector selects one capacitor path at a time.

10. The adaptive capacitive touch sense control circuit according to claim 1, wherein the control circuit is provided with a reference voltage by an external supply through a low drop-out linear regulator, and the reference voltage is divided by a resistor into two reference voltages respectively for the voltage buffer and the start comparator and the end comparator.

11. The adaptive capacitive touch sense control circuit according to claim 10, further comprising a selector and a plurality of sensor pad equivalent capacitors connected with the selector, wherein the selector selects one capacitor path at a time.

12. The adaptive capacitive touch sense control circuit according to claim 1, further comprising a selector and a plurality of sensor pad equivalent capacitors connected with the selector, wherein the selector selects one capacitor path at a time.

\* \* \* \* \*